United States Patent [19]
Meiler et al.

[11] Patent Number: 5,486,116
[45] Date of Patent: Jan. 23, 1996

[54] PLUG AND SOCKET CONNECTION SYSTEM FOR AN ELECTRONIC UNIT

[75] Inventors: Werner Meiler, Ebermannsdorf; Günther Deinhardt, Amberg, both of Germany

[73] Assignee: Siemens Aktiengelsellschaft, München, Germany

[21] Appl. No.: 135,612

[22] Filed: Oct. 12, 1993

[30] Foreign Application Priority Data

Oct. 14, 1992 [EP] European Pat. Off. ............. 92117567

[51] Int. Cl.⁶ ................................................. H01R 4/50
[52] U.S. Cl. ............................................. 439/347; 439/681
[58] Field of Search ..................... 439/347, 374, 439/378, 680, 681, 701

[56] References Cited

U.S. PATENT DOCUMENTS

| | | | |
|---|---|---|---|
| 4,344,663 | 8/1982 | Ognier et al. | 439/347 X |
| 4,836,408 | 6/1989 | Roy | 439/350 X |
| 4,952,175 | 8/1990 | Waters et al. | 439/681 |
| 5,125,849 | 6/1992 | Briggs et al. | 439/681 X |
| 5,145,385 | 9/1992 | Takano | 439/374 X |
| 5,173,063 | 12/1992 | Barkus et al. | 439/681 |
| 5,254,019 | 10/1993 | Noschese | 439/681 |

FOREIGN PATENT DOCUMENTS

| | | |
|---|---|---|
| 0165434 | 12/1985 | European Pat. Off. . |
| 3243132 | 6/1985 | Germany . |

*Primary Examiner*—Khiem Nguyen
*Attorney, Agent, or Firm*—Kenyon & Kenyon

[57] ABSTRACT

A plug and socket connection system for an electronic unit, consists of a connection plug for the connection of connecting lines and a socket for receiving the connection plug. In accordance with the present invention, both the socket and the connection. plug have at least one linearly guiding guide element for the guiding of the connection plug in correct position upon introduction of the connection plug into the socket and at least one locking element for the detachable locking of the connection plug in the plug socket, the locking elements cooperating by engagement in at least two positions.

16 Claims, 3 Drawing Sheets

PLUG AND SOCKET CONNECTION SYSTEM FOR AN ELECTRONIC UNIT

BACKGROUND OF THE INVENTION

The present invention relates generally to plug and socket connection systems, and more particularly to a plug and socket connection system for an electronic unit, preferably an encased electronic unit having a box shape. The plug and socket connection system consists of a connection plug for the coupling connecting lines and a socket to receive the connection plug.

U.S. Pat. No. 5,043,847, which is incorporated herein by reference (which is equivalent to EP 0 165 434 B1) discloses a device in which a front plug is provided with a swing joint on one end, to permit the front plug to swing inward and, with a screw for fastening the front plug on the other end. This type of attachment is still not entirely optimal since in the case of a swing plug the contact blades of the plug must be arranged in the plane of swing. As a result, the swing ;plug becomes large and unwieldy. In addition, it is not possible in the case of a swing plug to design an inexpensive method for fastening the plug to the unit in such a manner that, on the one hand, forces from fastening the plug and socket system are net transferred to the unit and, on the other hand, the plug is not yet in final contact with the unit.

The present invention is directed to the problem of developing a plug and socket connection system which permits a space-saving arrangement of the contact blades, and thus a compact plug, while, on the other hand, allows the plug to be fastened to the unit before the final mounting of the plug.

SUMMARY OF THE INVENTION

The present invention solves this problem by providing that both the socket and the connection plug have at least one linearly extending guide element, for instance a guide groove and a guide rail, for guiding the connection plug in its correct position upon .the introduction of the connection plug into the socket. Furthermore, the present invention provides that both the socket and the connection plug have at least one lock element for the detachably locking the connection plug in the socket, and that the lock elements cooperate in interengaging manner in at least two positions.

As a result of the linear guidance, there is no plane of swing, so that alignment of the contact blades is unnecessary. In this way, the plug and the socket can be more compact. Due to the linear guidance it is also possible to provide the plug and socket with locking elements which cooperate in interengaging manner in at least two positions so that a convenient connecting of connecting lines is possible.

If one of the locking elements, preferably the plug locking element arranged on the connecting plug, has a handle and is movably supported for movement between a locking position and a release position in an outer support, the connection plug can be connected to the socket and detached from the socket without the use of a tool.

If the movable locking element can be inserted in its outer support by substantially linear movements, for instance by pushing, and both the movable locking element and the socket or connection plug has a stop element so that the movable locking element is held in unlosable manner in its outer support, the construction of the movable locking element is particularly simple.

The connection plug is preferably electrically isolated from the socket in one of positions, hereinafter referred to as the pre-engagement position. In this way, the connecting lines connected to the connection plug can be easily measured through in the pre-engagement position. If, in order to receive the connection plug, the socket has a longitudinal channel which is open towards the connection plug, and at least one side wall, and if the socket guide element arranged on the socket is arranged on the side wall, then the connection plug can be connected in particularly stable manner to the socket and, in addition to this, is particularly precisely guided upon introduction into the socket.

The stability of the connection of connection plug and socket is particularly great both in the pre-engagement position and in the other position, the so-called final-engagement position, if the socket has at least two lock elements which are arranged in the longitudinal channel at the ends of said channel.

If a socket coding element is associated with the socket and a plug coding element is associated with the connection plug and if the plug coding element can be held interengaged in the connection plug and detachable from the socket coding element, it is possible to develop the coding so that it is self-coding.

If the plug coding element is arranged on the bottom side of the connection plug facing the socket and the socket coding element is arranged on the bottom of a longitudinal channel which receives the connection plug, the coding can be arranged in particularly space-saving manner on the connection plug and on the plug.

DETAILED DESCRIPTION

Figure 1:
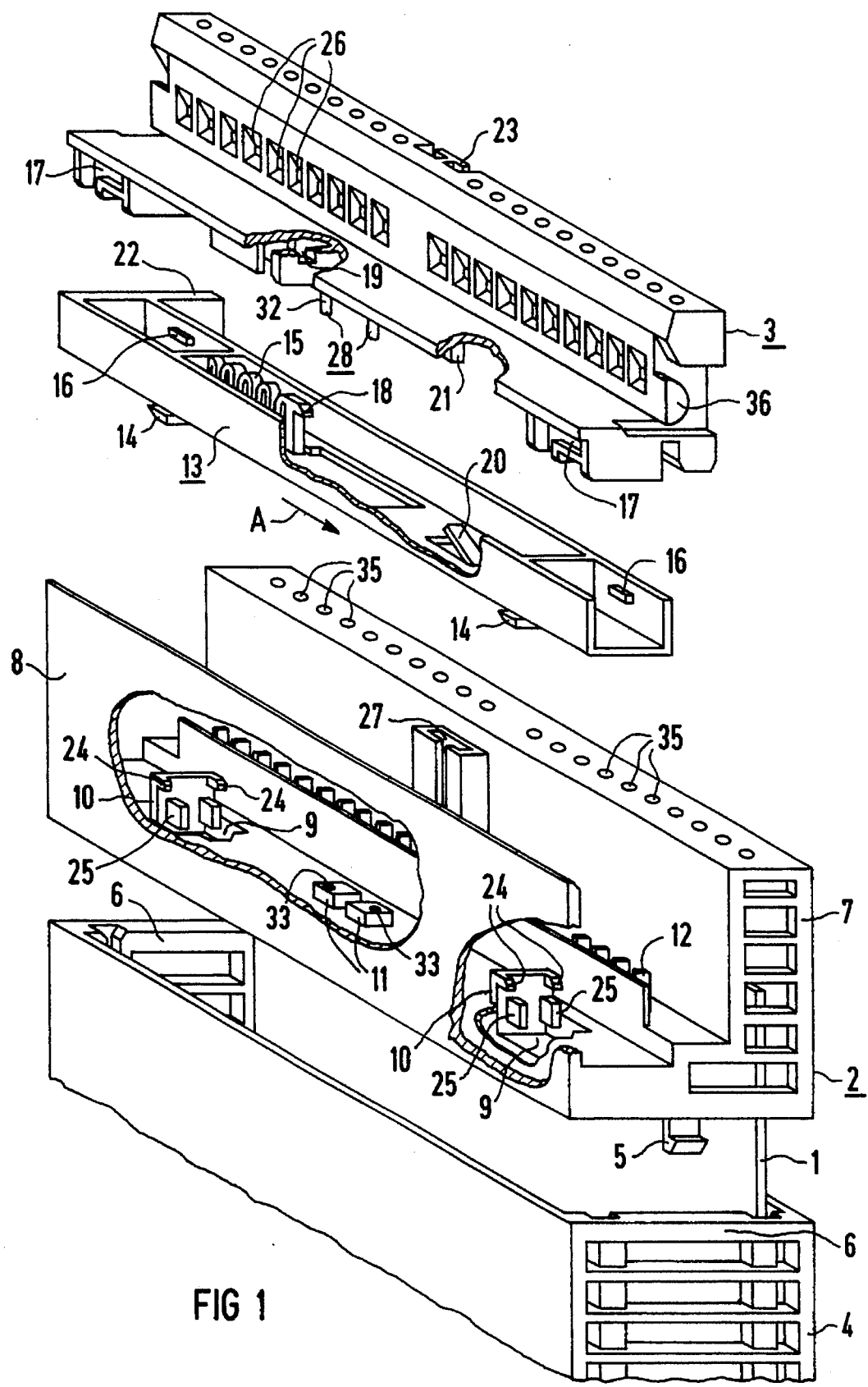
FIG. 1 is an exploded perspective view, partially in section, of the unit, including the socket and front plug.

Referring to FIG. 1, the electronic unit has a circuit board 1 on which an electronic circuit (not shown) is developed. The circuit can, for instance, be of the nature that the unit can used as digital input unit or digital output unit of a storage programmable control. A socket 2 is connected on the front side to the circuit board 1, it serving to receive the front plug 3.

The unit of the present invention is an encased box-shaped unit. Upon the assembling thereof, the circuit board 1 is pushed into the housing case 4 and after the insertion, engaged on the webs 6 of the housing case 4 by means of the detent hooks 5 which are arranged on the ends of the socket 2, only the front one of which hooks 5 is visible in the drawing.

The socket 2, as shown as FIG. 1, has a circuit board cover 7 and a wall 8. The circuit board cover 7 and the wall 8 form the walls of a longitudinal channel. The longitudinal channel is provided at its ends with two cutouts 9 in each of which a socket locking element 10 is arranged. Furthermore, in the center of the longitudinal channel two cutouts (not visible in the drawing) are arranged in the bottom of the longitudinal channel, in which cutouts the socket coding elements 11 are fastened. Furthermore, the blade strip 12 by means of which the front plug 3 can be electrically connected to the circuit board 1 is contained within the longitudinal channel. In addition, on the side of the circuit board cover 7 facing the longitudinal groove, approximately in the center of the longitudinal channel, there is arranged a linearly guiding guide element 27, for instance a dovetail guide or, as in this case, a tee-groove.

As can be noted from FIG. 1, the blades of the blade strip 12 are arranged transverse to the longitudinal channel. In this way, the portion of the longitudinal channel required for one of the contact blades is shorter than if the contact blades were aligned in the direction of the longitudinal channel. The front plug 3 can therefore be made compact. In addition to this, it is possible to arrange the contact blades individually and directly, i.e. without intermediate supports, on the circuit board 6.

The front plug 3 has a locking rail 13. The locking rail 13 is preferably designed as a single piece. The front plug 3 and the locking rail 13 can, for instance, by designed as or consist of injection moldings.

The locking rail 13 has two plug locking elements 14. The plug locking elements 14 in the present case are essentially short transverse ribs, arranged transverse to the longitudinal channel and having an entrance bevel at one end.

The locking rail 13 is connected with the front plug 3 in the following manner:

First of all the spring 15, which is preferably developed as a plastic spring, is inserted into the locking rail 13. The spring 15 may also be developed on the locking rail 13 or on the front plug 3. The projections 16 of the locking rail 13 are then introduced into the grooves 17 of the front plug 3.

By simply pushing the locking rail 13 in the direction indicated by the arrow A, the detent hook 18 of the spring 15 first comes into engagement with the cutout 19 in the front plug 3. This position of the locking rail 13 corresponds to the position in which the spring 15 is not tensioned. If the locking rail 13 is now pushed somewhat further in the direction indicated by the arrow A, the spring rail stop element 20 is pushed over the plug stop element 21. In this way, the locking rail 13 is engaged with the front plug 3. The locking rail 13 is thereby held in unlosable manner in the grooves 17.

If the locking rail 13 is now released, then due to the spring action, it moves backwards opposite the direction of the arrow A until the stop elements 20, 21 stop this movement. In this position, the spring 15 is only slightly tensioned. This position is the locking position of the locking rail 13. By pushing on the handle 22, the locking rail 13 can be moved in the direction of the arrow A until the ends of the grooves 17 stop this movement also. This position is the detachment position of locking rail 13.

Due to the simple construction of front plug 3 and locking rail 13, as well as the simple unit by means of pushing, the front plug 3, together with the locking rail 13, can be produced very inexpensively. In addition, the assembling can be automated.

The connecting of the front plug 3 to the socket 7 is effected in the following manner:

The tee-rail 23 of the front plug 3 is introduced into the tee-groove 27 of the circuit-board cover 7. By means of these guide elements, the front plug 3 is necessarily introduced in correct position into the socket 2. Upon its introduction, the transverse rails 14 first of all strike against the beveled detent hooks 24. Since both the detent hooks 24 and the transverse rails 14 are beveled, the spring 15 is compressed and locking rail 13 moves in the direction indicated by the arrow A. After passing the detent hooks 24, the further movement of the front plug 3 is stopped by the projections 25. The front plug 3 is now in the pre-engagement position. In this position, easy introduction of connecting lines into the connecting-line introduction openings 26 in the front plug 3 is possible. The forces occurring upon the connecting of the connecting lines (not shown in FIG. 1) are transmitted in the pre-engagement position to the circuit-board cover 7 or the locking elements 10. The connecting lines can be fixed after their connection on one of the fastening lugs 36 by means of known cable fixing means.

In the pre-engagement position, the front plug 3 is electrically separated from the blade strip 12. In this way, damage to the circuit board 1 and to the circuit arranged on it is definitely avoided. Furthermore, easy measuring of the connecting lines (not shown) is possible.

In order to bring the front plug 3 into the final engagement position, the locking rail 13 must first of all be unlocked by pushing the handle 22. The front plug 3 can then be pushed further into the socket 2. After the transverse rails 14 have passed the projections 25, the from plug 3 is automatically engaged in the final engagement position by the pressure of the spring 15. The front plug 3 can be released from this final engagement position by again actuating the handle 22.

Figure 2:
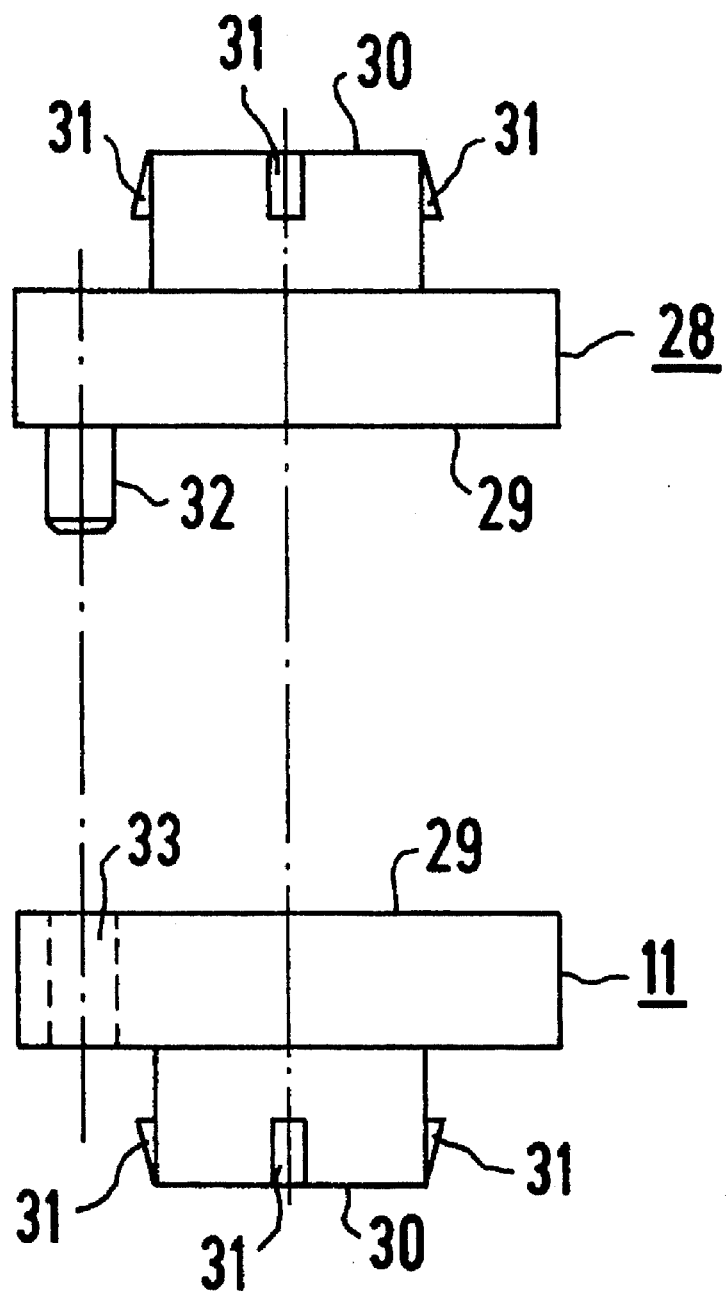
FIG. 2 is an elevational view of the coding elements.

As mentioned above. the socket 2 has two socket coding elements 11 opposite which, of course, there are two corresponding plug coding elements 28 on the front plug 3. By means of the coding elements 11, 28, the result is obtained that only the "correct" front plug 3 can be contacted with the corresponding socket 2. The basic construction of the coding elements 11, 28 is shown in FIG. 2. According to FIG. 2, each of the coding elements 11, 28 consists of a base body 29 and a detent projection 30. Both the base member 29 and the detent projection 30 have a square cross section. In the center of the four sides of the detent projections 30 there are arranged small detent noses 31 by means of which the coding elements 11, 28 can engage in corresponding recesses in the socket 12 and the front plug 3 respectively.

Due to the square cross section of the detent projections 30, four coding positions are possible. In the same way, however, other cross sections having, for instance, 6 or 8 coding positions are also possible. In addition to this, the detent projections 30 are developed the same in the case of both coding elements 11, 28. In this way the socket coding element 11 can also be inserted into the front plug 3 and the plug coding element 28 can also be inserted into the longitudinal channel. In this way, twice the number of codings are obtainable for each pair of coders 11, 28.

The coding is effected in the present case by a pin 32 which is asymmetrically arranged on the plug coding element 28 and is beveled on its upper end. The pin 32 is introduced into a corresponding hole 33 upon the introduction of the front plug 3 into the socket 2 provided that the codings of socket 2 and front plug 3 agree. Otherwise, the pin 32 prevents the contacting of the front plug 3 with the blade strip 12.

The diameter of the hole 33 is preferably slightly smaller than the diameter of the pin 32 so that the coding elements 11, 28 can be inserted in each other and separated from each other by the exertion of a slight force. In this way it is namely made possible to develop the socket 2 and the front plug 3 in self-coding manner. This is effected as follows:

Before the first bringing together of socket 2 and front plug 3, the socket coding element 11 is already engaged in the corresponding cutouts of the socket 2. The pin 32 is in the hole 33 so that the plug coding element 28 is connected, not interengaged, with the socket coding element 11. Upon the first placing together of (still uncoded) front plug 3 and socket 2, the plug coding element 28 engages on the bottom of the front plug 3 by means of the detent noses 31. In this way, the front plug 3 is coded. After the first placing together of front plug 3 and socket 2, the front plug 3 can now only be inserted in this socket 2 or in a socket having the same coding. The erroneous pairing of plug parts which do not correspond to each other is therefore avoided with a probability bordering on certainty.

Both the coding as such and the development of the coding elements 11, 28 as self-coding elements 11, 28 can be used, in principle, also in the case of other plugs, for example ones having a swing mount. Both a type-specific coding of the units and an application-specific coding of the units is possible. In a type-specific coding, the coding of the units is established by the manufacturer of the units, for instance 220 volt input units are given a different coding than 24 volt output units. Upon application-specific coding, the manufacturer supplies the uncoded unit to the user. The coding can then be effected by the user in accordance with his own ideas.

Figure 3:
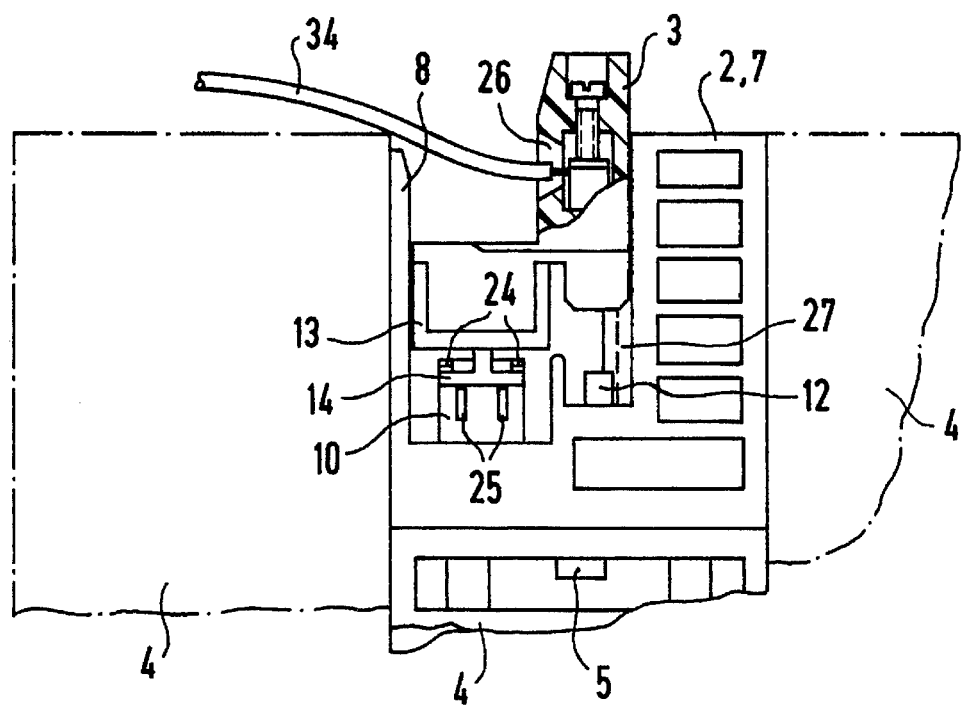
FIG. 3 depicts the pre-engagement position of the front plug.
Figure 4:
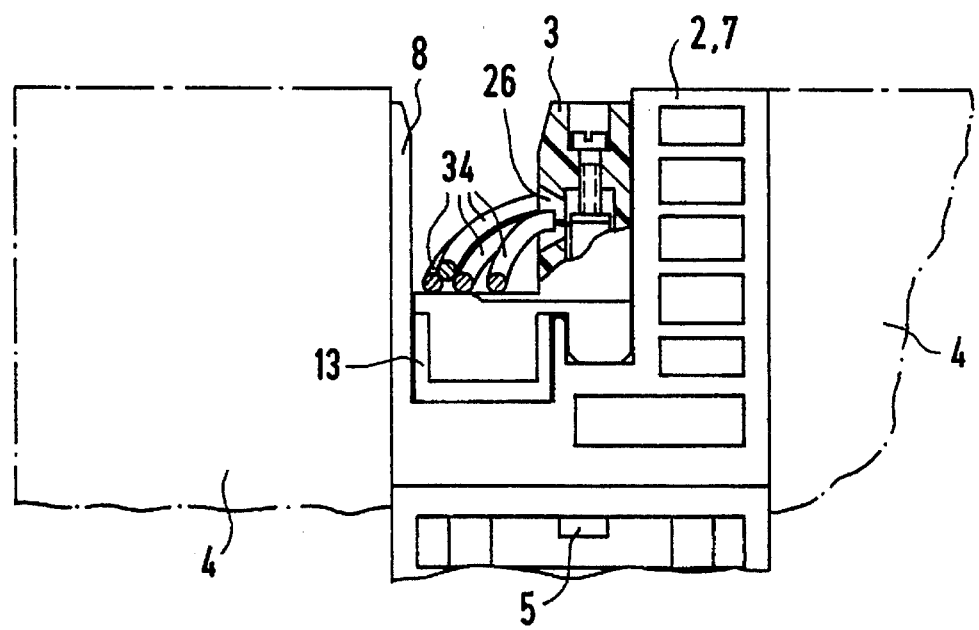
FIG. 4 shows the final engagement position of the front plug.

On basis of FIGS. 3 and 4, it can be seen particularly clearly that in the pre-engagement position, the connecting line introduction openings 26 are readily accessible while in the final engagement position of the front plug 3 the connecting lines 34 are arranged completely within the longitudinal channel. In this way, it is easily possible to cover the entire unit with one cover which is typically developed at the same time as legend-containing mask. It is, for instance, possible to provide on the front of the circuit-board cover a row of light-emitting diodes 35 which corresponds to the connecting line introduction openings 26 so that the conditions represented by the light-emitting diodes 35 can be associated in particularly simple manner with the individual connecting lines 34. If, furthermore, a legend line is provided on the legend mask for each light-emitting diode 35, the technical process information can be particularly easily and simply noted by the user.

What is claimed is:

1. A plug and socket connection system comprising:

a) a connection plug for the coupling of a plurality of connecting lines, said connection plug having a first linear guiding element and a first locking element; and b) a socket for mating with said connection plug, said socket having a second linear guiding element, and having a second locking element, wherein said first and second guiding elements cooperate to guide the connection plug and the socket into a correct position when mating the connection plug and the socket, the first and second locking elements permit the connection plug to be detachably locked in the socket, and the first and second locking elements cooperate by engaging in at least two positions;

wherein the connection plug is isolated electrically from the socket in one of the engaged positions.

2. The plug and socket connection system according to claim 1, wherein the first guiding element comprises a guide groove and the second guiding element comprises a guide rail.

3. The plug and socket connection system according to claim 1, wherein the second guiding element comprises a guide groove and the first guiding element comprises a guide rail.

4. The plug and socket connection system according to claim 1, wherein the plug further comprises an outer support, and the first locking element further comprises a handle, whereby the first locking element can be moved between a locked position and a release position on the outer support.

5. The plug and socket connection system according to claim 4, wherein the first locking element can be introduced into the outer support by substantially linear movements, and the first locking element and the socket each has a stop element, whereby the first locking element is held securely in the outer support.

6. The plug and socket connection system according to claim 4, further comprising a spring associated with said first locking element, whereby said first locking element is held in the locked position.

7. The plug and socket connection system according to claim 6, wherein the spring comprises a plastic spring.

8. The plug and socket connection system according to claim 6, wherein the spring is only slightly tensioned in the locked position.

9. The plug and socket connection system according to claim 2, wherein the first locking element comprises a single injection molded piece.

10. The plug and socket connection system according to claim 1, wherein at least one of the first or second locking elements further comprises a bevel element, whereby the connection plug automatically engages with the socket when the connection plug is introduced into the socket.

11. The plug and socket connection system according to claim 1, wherein the socket further comprises a longitudinal channel which is open towards the connection plug, said longitudinal channel having a side wall, wherein the second guiding element is disposed on the side wall.

12. The plug and socket connection system according to claim 11, wherein the second guiding element is disposed approximately in the center of the side wall.

13. The plug and socket connection system according to claim 11, wherein the socket further comprises at least two locking elements which are disposed in the longitudinal channel at the ends of the longitudinal channel.

14. A box shaped electronic device comprising a front plug and socket connection system, said front plug and socket connection system including:

a) a connection plug for the coupling a plurality of connecting lines, said connection plug having a first linear guiding element and a first locking element; and b) a socket for mating with said connection plug, said socket having a second linear guiding element, and having a second locking element, wherein said first and second guiding elements cooperate to guide the connection plug and the socket into a correct position when mating the connection plug and the socket, the first and second locking elements permit the connection plug to be detachably locket in the socket, and the first and second locking elements cooperate by engaging in at least two positions wherein the connection plug is isolated electrically from the socket in one of the engaged positions.

15. A socket for mating with a plug connection of a plug and socket connection system for coupling a plurality of connecting lines, in which the connection plug has a first linear guiding element, and a first locking element, said socket comprising:

a) a second linear guiding element;

b) a second locking element, wherein said first and second guiding elements cooperate to guide the connection plug and the socket into a correct position when mating the connection plug and the socket, the first and second locking elements permit the connection plug to be detachably locked in the socket, and the first and second locking elements cooperate by engaging in at least two positions wherein the connection plug is isolated electrically from the socket in one of the engaged positions.

16. A plug connection for mating with a socket of a plug and socket connection system for coupling a plurality of connecting lines, in which the socket has a first linear guiding element, and a first locking element, said plug connection comprising:

a) a second linear guiding element;

b) a second locking element, wherein said first and second guiding elements cooperate to guide the connection plug and the socket into a correct position when mating the connection plug and the socket, the first and second locking elements permit the connection plug to be detachably locked in the socket, and the first and second locking elements cooperate by engaging in at least two positions wherein the connection plug is isolated electrically from the socket in one of the engaged positions.

* * * * *